(12) United States Patent
Lin et al.

(10) Patent No.: US 7,173,846 B2
(45) Date of Patent: Feb. 6, 2007

(54) MAGNETIC RAM AND ARRAY ARCHITECTURE USING A TWO TRANSISTOR, ONE MTJ CELL

(75) Inventors: Wen-Chin Lin, Hsin-Chu (TW); Denny D. Tang, Saratoga, CA (US); Yu Der Chih, Hsin-Chu (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 369 days.

(21) Appl. No.: 10/366,499

(22) Filed: Feb. 13, 2003

(65) Prior Publication Data

US 2004/0160809 A1    Aug. 19, 2004

(51) Int. Cl.
*G11C 11/00* (2006.01)
(52) U.S. Cl. .................. 365/158; 365/171; 365/173
(58) Field of Classification Search ................ 365/158, 365/171, 173
See application file for complete search history.

(56) References Cited

U.S. PATENT DOCUMENTS

| 6,166,948 | A  | * | 12/2000 | Parkin et al. | ............... | 365/173 |
| 6,304,477 | B1 |   | 10/2001 | Naji | ............................ | 365/50 |
| 6,331,943 | B1 |   | 12/2001 | Naji et al. | ................... | 365/158 |
| 6,335,890 | B1 |   | 1/2002  | Reohr et al. | ............. | 365/225.5 |
| 6,418,046 | B1 |   | 7/2002  | Naji | ............................ | 365/158 |
| 6,781,871 | B2 | * | 8/2004  | Park et al. | ................... | 365/158 |
| 6,791,865 | B2 | * | 9/2004  | Tran et al. | ................... | 365/158 |
| 6,909,628 | B2 | * | 6/2005  | Lin et al. | ..................... | 365/158 |

* cited by examiner

*Primary Examiner*—Huan Hoang
(74) *Attorney, Agent, or Firm*—Haynes and Boone, LLP

(57) ABSTRACT

A new magnetic RAM cell device is achieved. The device comprisese, first, a MTJ cell comprising a free layer and a pinned layer separated by a dielectric layer. A reading switch is coupled between the free layer and a reading line. A writing switch is coupled between a first end of the pinned layer and a first writing line. A second end of the pinned layer is coupled to a second writing line. Architectures using MRAM cells are disclosed.

33 Claims, 6 Drawing Sheets

MAGNETIC RAM AND ARRAY ARCHITECTURE USING A TWO TRANSISTOR, ONE MTJ CELL

BACKGROUND OF THE INVENTION (1) Field of the Invention

The invention relates to a magnetic RAM device and, more particularly, to a magnetic RAM device based on a magnetic tunnel junction cell.

(2) Description of the Prior Art

Magnetic memory devices, based on magnetic tunnel junction (MTJ) cells, are an important new type of memory technology. Magnetic RAM arrays can be formed on an integrated circuit to provide non-volatility, high speed, low writing energy, infinite write cycles, and immunity to radiation. These advantages make magnetic RAM a technology with great promise.

Referring now to FIG. 1, models of magnetic tunnel junction cells 10 and 30 are illustrated. A magnetic tunnel junction cell 10 and 30 comprises a pinned layer 14, a free layer 18, and a dielectric layer 22. Typically, the free layer 18 and the pinned layer 14 comprise ferromagnetic materials that can be magnetically oriented. The free layer 18 is configured such that the magnetic orientation can be changed, or rotated, by exposure to an external magnetic field. The pinned layer 14 is configured such that the magnetic orientation is fixed and will not respond to a typical magnetic field. The dielectric layer 22 typically comprises a relatively thin oxide layer capable of electrically isolating the free layer 18 from the pinned layer 14 at low potentials and capable of conducting current through electron tunneling at higher potentials. The dielectric layer 22 may be called a tunnel layer.

In the first MTJ cell 10, the pinned layer 14 and the free layer 18 are magnetically oriented in opposite directions. In the second MTJ cell 30, the pinned layer 14 and the free layer 18 are magnetically oriented in the same direction. If the same current value $I_{CONSTANT}$ 32 is forced through each cell 10 and 30, it is found that the first cell 10 voltage $V_1$ is larger than the second cell 30 voltage $V_2$. In general, the resistance of an opposite-oriented MTJ cell 10 is greater than the resistance of a same-oriented MTJ cell 30. Binary logic data ('0' and '1') can be stored in a MTJ cell and retrieved based on the cell orientation and resulting resistance. Further, since the stored data does not require a storage energy source, the cell is non-volatile.

Referring now to FIG. 2, the program scheme of a prior art, MTJ cell 10 is illustrated. The MTJ cell 10 is electrically coupled to a bit line (BL) 40 overlying the free layer 18. A program line (PL) 48 runs under the MTJ cell 10. However, the PL 48 is electrically isolated from the MTJ cell 10 by a dielectric material such that a large gap 58 exitsts. To program the cell, PL 48 conducts a writing current $I_{WRITE}$ to generate magnetic field $H_{DATA}$ 52. The direction of $H_{DATA}$ 52 depends on the direction of $I_{WRITE}$. In addition, an assist current $I_{ASSIST}$ is conducted by the BL 40. $I_{ASSIST}$ generates a magnetic field $H_{ASSIST}$ 56 that is orthogonal to the longitudinal axis of the cell 10. The $H_{ASSIST}$ 56 field assists the $H_{DATA}$ 52 field in switching the magnetic orientation of the free layer 18 but will not program the cell without the $H_{DATA}$ 52 field generated by the program line 48. Therefore, the cell 10 at the intersection of an active program line 48 and an active bit line 40 is programmed.

There are two significant problems with this design. First, the magnetic coupling between the PL 48 and the cell 10 is not optimal due to the gap 58. Therefore, a large writing current $I_{WRITE}$ must be used to generated adequate field strength. This large writing current can approach the electromigration limit of the conductor and prevents downward scaling of the RAM cell 10. Second, there can be many other non-selected cells that are exposed to magnetic fields generated by the active program line 48 and bit line 52.

Referring now to FIG. 3, an exemplary MRAM array 60 is illustrated. A 2×2 array of cells is shown. Each cell comprises a MTJ cell and a transistor as shown by R0 66 and M0 64, R1 70 and M1 68, R2 74 and M2 72, R3 78 and M3 76. Each transistor is coupled to a word line signal Wn 82 or Wn+1 86. A cell is written by asserting the word line of that cell, forcing a reading current through the bit line of that cell, and then measuring the voltage on that bit line. For example, to read the state of MTJ cell R1 70, the word line Wn 82 is asserted to turn ON M1 68. The free layer of R1 70 is thereby coupled to ground 80 through M1 68. Next, the reading current is forced on bit line Bn+1 94. Since only reading transistor M1 68 is turned ON, the reading current flows through the R1 cell 70 to ground 80. The voltage of Bn+1 is then measured to determine the state ('0' or '1') of the cell R1 70. Each cell has one reading transistor. Therefore, this type of MRAM architecture is called '1T1R'.

The cells are written using the method described above and illustrated in FIG. 2. Referring again to FIG. 3 and for example, the MTJ cell R2 74 is written by forcing the writing current through the programming line PLn+1 86 and the assist current though the bit line Bn 90. PLn+1 86 and Bn 90 intersect at cell R2 74 such that R2 is programmed. However, note that PLn+1 98 also runs under the non-selected cell R3 78. Therefore, cell R3 is "half-selected." The magnetic field generated by PLn+1 98 can disturb, or flip, the state of R3 78. In addition, Bn 90 also couples to the non-selected cell R0 66. The assist field created by Bn 90 can disturb the state of R0 66. These "half-select" disturbances can cause loss of data or change of switching thresholds.

Referring now to FIG. 4, a second prior art MRAM array architecture 100 is illustrated. This array 100 uses two transistors for each MTJ cell and is called a 2T1R array. To improve the programming efficiency, the programming current runs through the MTJ cell directly through the pinned layer or through a conductive layer laminated to the pinned layer. By running the programming current in the MTJ instead of in an adjacent conductor, the magnetic coupling is improved such that the programming current can be reduced to about ⅕ the level of the cell illustrated in FIG. 2. Referring again to FIG. 4, the programming current path is changed such that the longitudinal axis of the cell is orthogonal to the writing current path. In this way, the cells can be programmed solely by the magnetic field generated by the programming current without an assist field.

For example, the program cell R1 108, word line W1 is asserted to turn ON transistors M3 109 and M4 110. Next, a writing current is passed through cell R1 108 either from P2 134 to P2' 138 or from P2' 138 to P2 134. The writing current will generated a magnetic field to orient the free layer in R1 108. Note that there are no half-selected cells since the programming current only flows through the selected cell. Each MRAM cell in this array 100 requires two transistors, two programming lines, a bit line, and a word line. While this MRAM architecture is a significant improvement over the previous art shown in FIGS. 1–3, the addition of a transistor to each cell is a significant disadvantage. Further, since both transistors must carry a large programming current, the transistors must be relatively large. In fact, the writing transistors occupy most of the cell area.

Several prior art inventions relate to magnetic RAM devices. U.S. Pat. No. 6,418,046 B1 to Naji teaches an architecture for a MRAM. The MRAM cell is programmed by flowing currents through metal bit lines and digit lines intersecting at the magnetic tunnel junction (MTJ) device. U.S. Pat. No. 6,335,890 B1 to Reohr et al discloses a MRAM architecture where write lines are segmented to reduce cell interference during programming. U.S. Pat. No. 6,331,943 B1 to Naji et al describes a MRAM architecture. U.S. Pat. No. 6,304,477 B1 to Naji teaches a MRAM having content-addressable capability.

SUMMARY OF THE INVENTION

A principal object of the present invention is to provide an effective and very manufacturable magnetic RAM integrated circuit device.

A further object of the present invention is to provide a magnetic RAM device comprising a magnetic-tunnel junction (MTJ) device.

A yet further object of the present invention is to provide magnetic RAM cells comprising a write transistor, a read transistor, and one MTJ cell.

A yet further object of the present invention is to provide a magnetic RAM cell with reduced cell size.

A yet further object of the present invention is to provide magnetic RAM cells with low programming current.

A yet further object of the present invention is to provide efficient magnetic RAM array devices.

Another further object of the present invention is to provide unique methods to write and to read a magnetic RAM cell.

Another further object of the present invention to provide a method to form a magnetic RAM array device.

In accordance with the objects of this invention, a magnetic RAM cell device is achieved. The device comprises, first, a MTJ cell comprising a free layer and a pinned layer separated by a dielectric layer. A reading switch is coupled between the free layer and a reading line. A writing switch is coupled between a first end of the pinned layer and a first writing line. A second end of the pinned layer is coupled to a second writing line.

Also in accordance with the objects of this invention, a magnetic RAM array device is achieved. The device comprises, first, a plurality of first writing lines, a plurality of reading lines, a plurality of second writing lines, a plurality of word lines, and a plurality of magnetic RAM cells. Each magnetic RAM cell comprises a MTJ cell comprising a free layer and a pinned layer separated by a dielectric layer. A reading switch is coupled between the free layer and one of the reading lines. A writing switch is coupled between a first end of the pinned layer and one of the first writing lines. The reading and writing switches are coupled to one of the word lines. A second end of the pinned layer is coupled to one of the second writing lines.

Also in accordance with the objects of this invention, a magnetic RAM array device is achieved. The device comprises a plurality of reading lines, a plurality of writing lines, a plurality of reading word lines, a plurality of writing word lines, and a plurality of magnetic RAM cells. Each magnetic RAM cell comprises a MTJ cell comprising a free layer and a pinned layer separated by a dielectric layer. A reading switch is coupled between the free layer and one of the reading lines. The reading switch is controlled by one of the reading word lines. A writing switch is coupled between a first end of the pinned layer and one of the reading lines. The writing switch is controlled by one of the writing word lines. A second end of the pinned layer is coupled to one of the writing lines.

Also in accordance with the objects of this invention, a method of forming a magnetic RAM cell array is achieved. The method comprises providing a plurality of MTJ cells each comprising a free layer and a pinned layer separated by a dielectric layer. A plurality of reading switches each comprising a MOS transistor having gate, drain, and source terminals is formed. A plurality of writing switches each comprising a MOS transistor having gate, drain, and source terminals is formed. A patterned conductive layer is formed. The patterned conductive layer selectively couples each of the reading switch sources to one of the MTJ cell free layers. The patterned conductive layer selectively couples one of the writing switch sources to a first end of one of the MTJ cell pinned layers.

Also in accordance with the objects of this invention, a magnetic RAM array device is achieved. The device comprises a plurality of bit lines, a plurality of reading lines, a plurality of word lines, and a plurality of magnetic RAM cells. Each magnetic RAM cell comprises a MTJ cell comprising a free layer and a pinned layer separated by a dielectric layer. The free layer is coupled to one of the reading lines. A first switch is coupled between a first end of the pinned layer and a first bit line of the bit lines. A second switch is coupled between a second end of the pinned layer and a second bit line of the bit lines. The first switch and the second switch are controlled by one of the word lines. Adjacent magnetic RAM cells in a row share a common bit line of the bit lines. The adjacent magnetic RAM cells in a row do not share a common word line of the word lines.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose magnetic RAM devices. Methods of forming, programming, and reading magnetic RAM devices are disclosed. It should be clear to those experienced in the art that the present invention can be applied and extended without deviating from the scope of the present invention.

Figure 1:
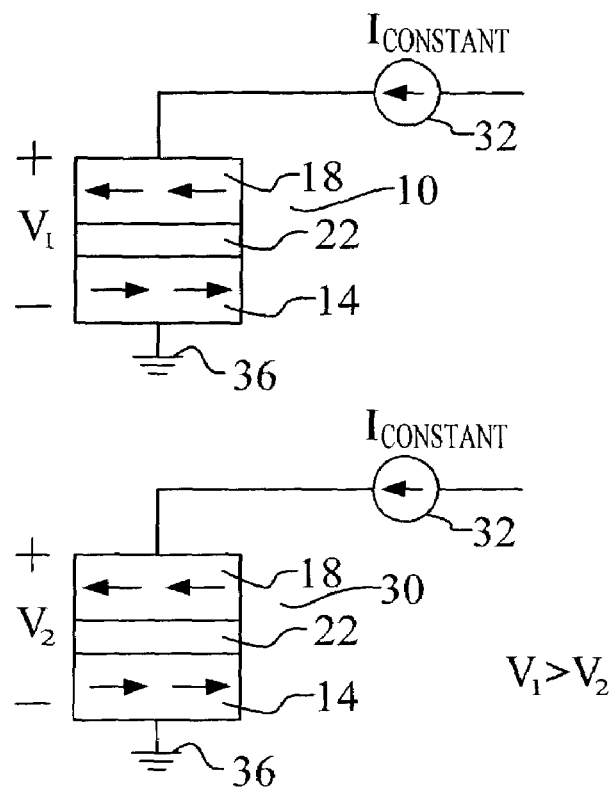
FIG. 1 illustrates reading a magnetic tunnel junction device.
Figure 2:
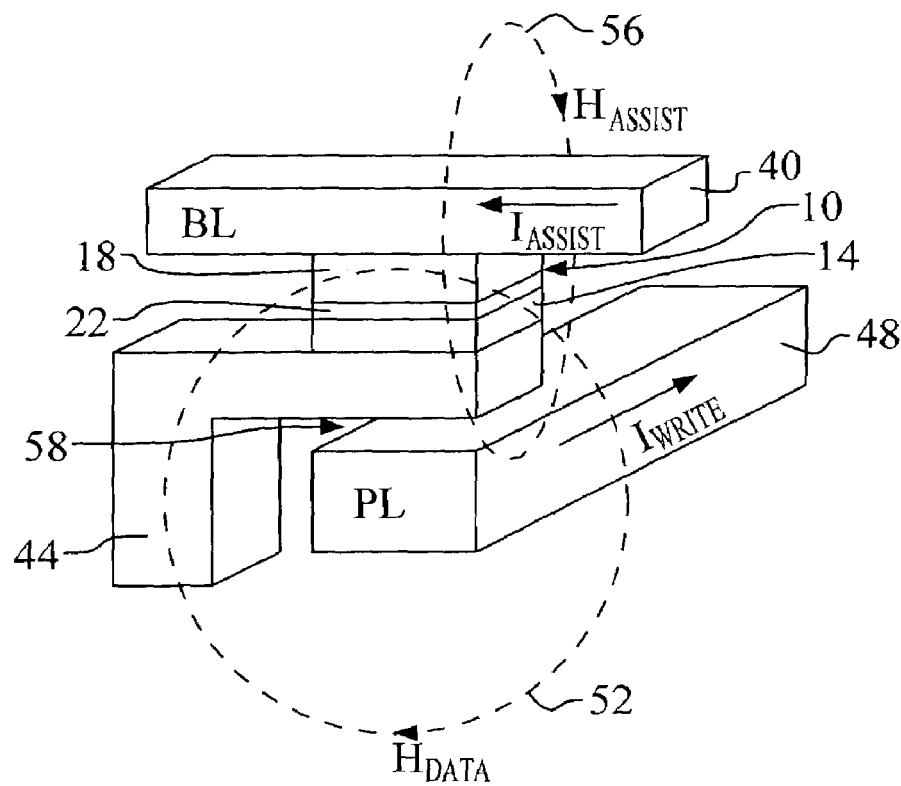
FIG. 2 illustrates writing a magnetic tunnel junction device.
Figure 3:
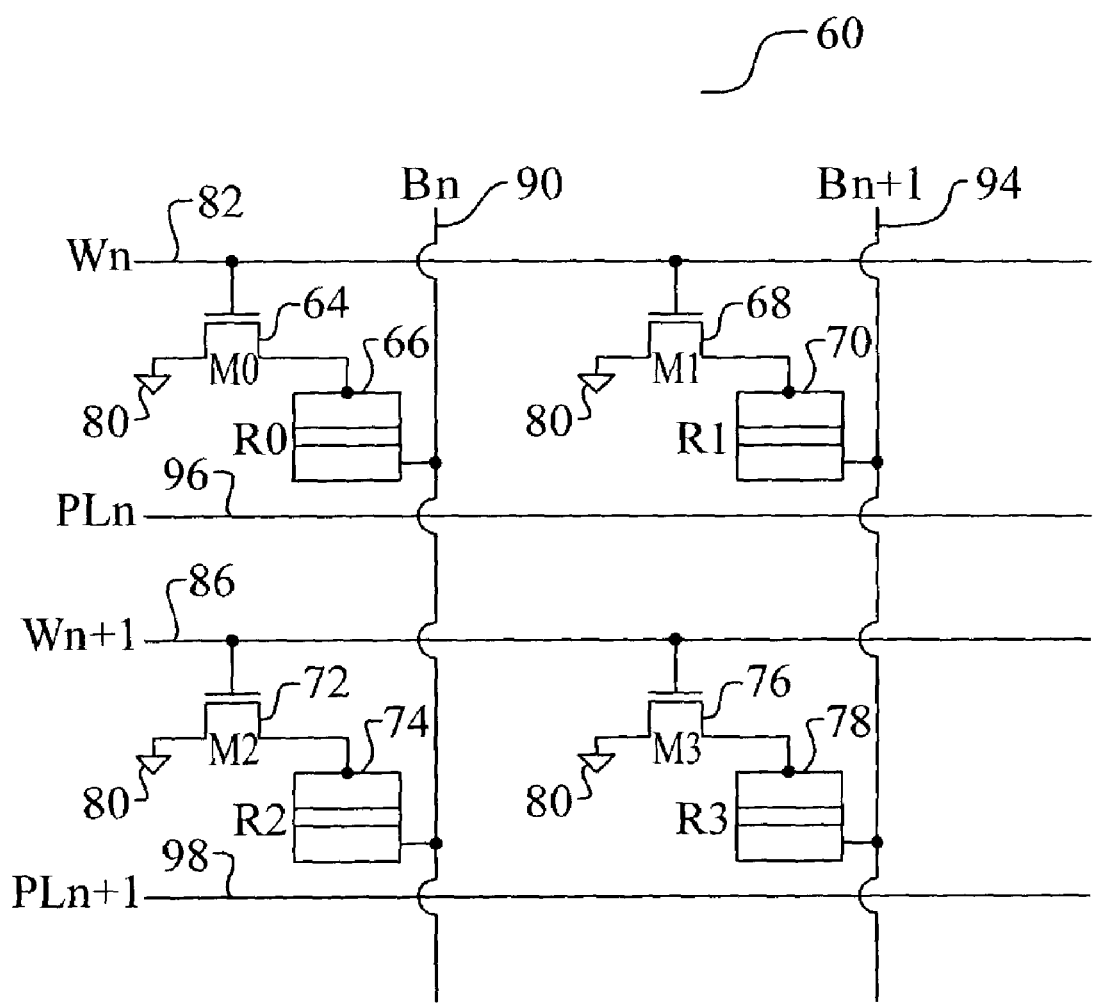
FIG. 3 illustrates a MRAM array of the prior art.
Figure 4:
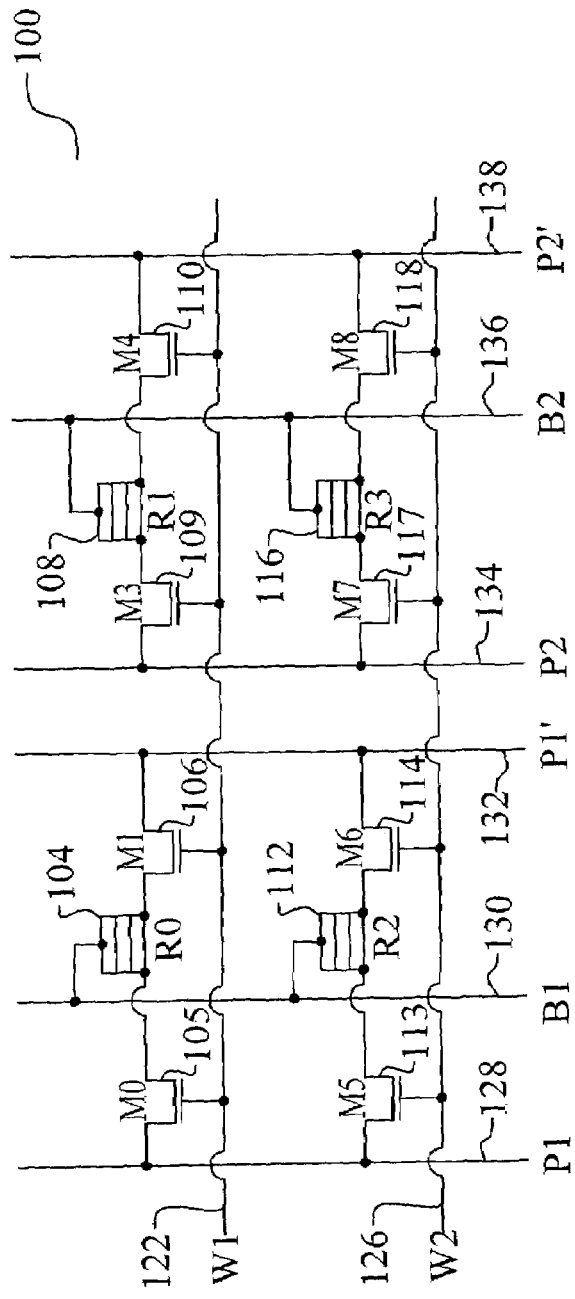
FIG. 4 illustrates an improved MRAM array of the prior art.
Figure 5:
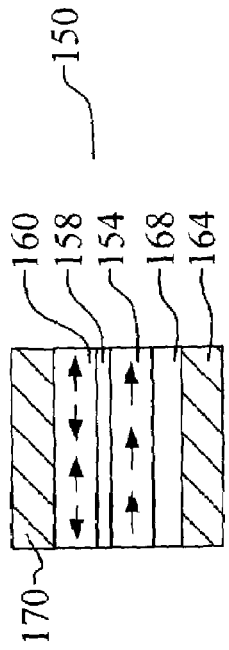
FIG. 5 illustrates a preferred embodiment of a magnetic tunnel junction device of the present invention.

Referring now to FIG. 5, a preferred embodiment of the present invention is illustrated. Several important features of the present invention are shown and discussed below. A MTJ cell 150 is illustrated. The MTJ cell 150 comprises a pinned layer 154 and a free layer 160 separated by a dielectric layer 158. The pinned layer 154 and free layer 160 preferably comprise ferromagnetic materials that can be magnetized. The dielectric layer 158 preferably comprises an oxide layer. In addition, the dielectric layer 158 is made relatively thin so that it will conduct current by tunneling when a sufficiently large voltage is applied across the dielectric layer 158.

In addition, the MTJ cell 150 may comprise an anti-ferromagnetic layer 168. The anti-ferromagnetic layer 168 is used to fix the magnetic orientation of the pinned layer 154. A first conductor layer 164, such as a metal, may be added to the pinned side of the cell 150. The first conductor layer 164 reduces the resistance of the pinned side of the cell, especially for programming. It is understood that current flow can occur in any of the layers on the pinned side of the cell. Therefore, the combined pinned layer 154, anti-ferromagnetic layer 168, and first conductor layer 164 are referred to simply as the pinned layer 154 in the remainder of the description. A second conductor layer 170 may be added to the free side of the cell to reduce the resistivity during reading. Again, current flow can occur in either the free layer 160 or the second conductor layer 170. These two layers are simply referred to as the free layer in the remainder of the description.

Figure 6:
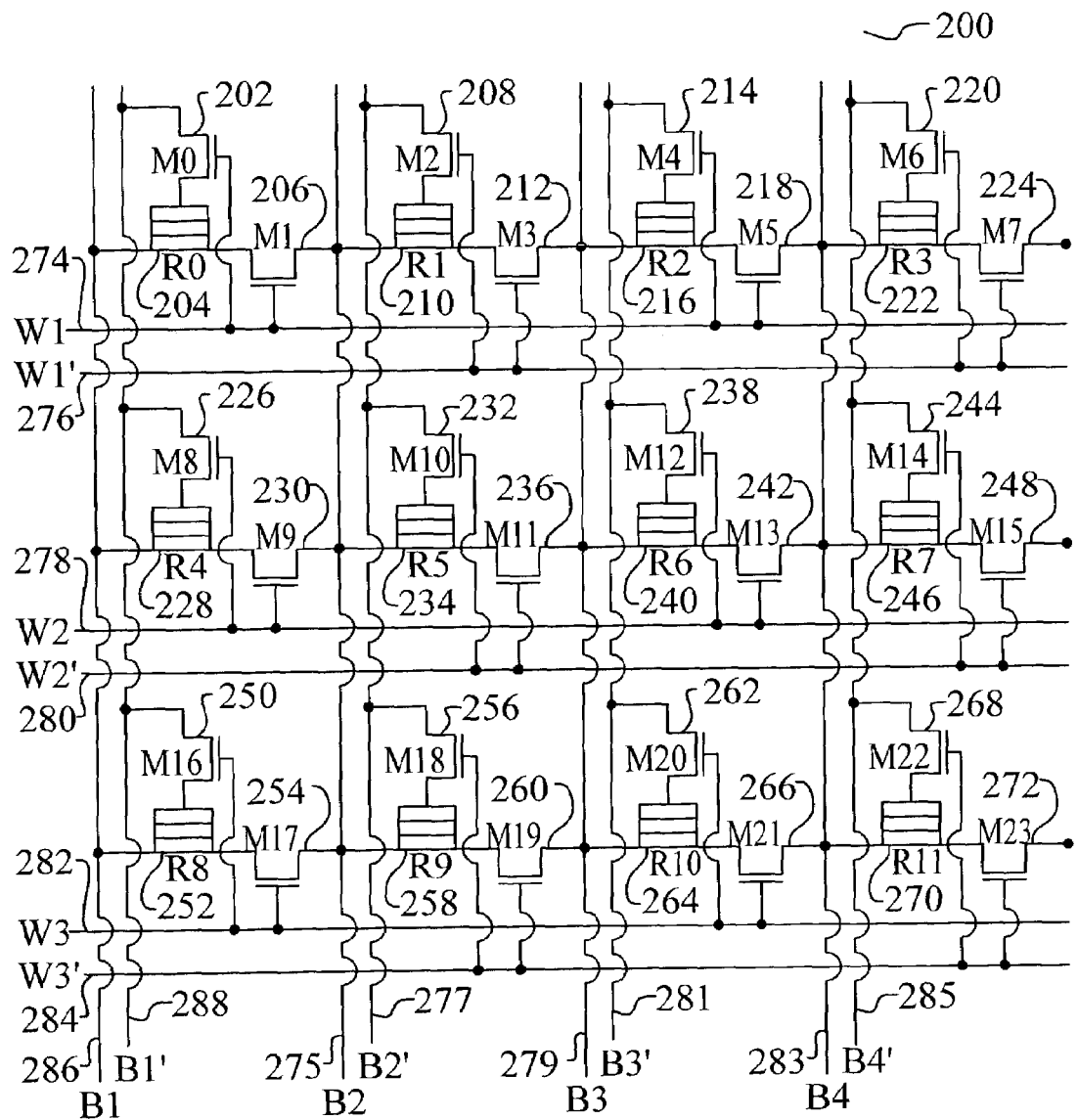
FIG. 6 illustrates a first preferred embodiment of a MRAM array of the present invention.
Figure 6:
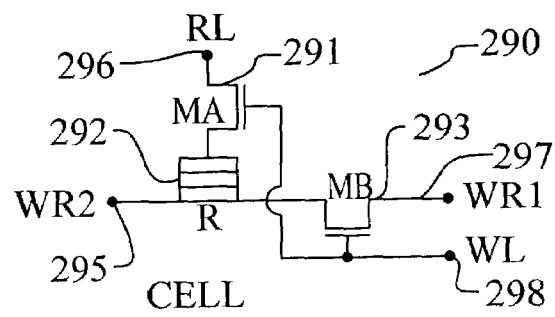

Referring now to FIG. 6, a first preferred embodiment of a MRAM array 200 of the present invention is illustrated. The array 200 uses a unique MRAM cell 290 as shown. The MRAM cell 290 comprises a MTJ cell 292 comprising a pinned layer, a free layer, with a dielectric layer therebetween. A reading switch MA 291 is coupled between the free layer of the MTJ cell and a reading line RL 296. A writing switch MB 293 is coupled between a first end of to the pinned layer of the MTJ cell and first writing line WR1 297. The reading and writing switches MA 291 and MB 293 are controlled with a common word line signal WL 298. The second end of the pinned layer is coupled to a second writing line WR2 295. The array 200 comprises first, a plurality of first and second writing lines B1–B4, a plurality of reading lines B1'–B4', a plurality of word lines W1–W3 and W1'–W3', and a plurality of magnetic RAM cells R0–R11.

This cell arrangement has several unique features. The MRAM cell is a 2T1R cell. However, only one of the transistors carries a large programming current. The other transistor only carries the relatively small reading current. For example, to read cell R2 216, the word line W1 is asserted to turn ON the reading switch M4 214. A reading current is then coupled through the reading line B3', the reading switch M4 214, the free layer, dielectric layer, and pinned layer of R2 216, and into the second writing line B3 279. In addition, since the asserting of the word line W1 also turns ON the writing switch M5 218, a part of the reading current may also be coupled through the writing switch M5 218 and into the first writing line B4 183. For example, the first and second writing lines B3 and B4 could be grounded while the reading current is coupled to the reading line B3'. The voltage on B3' could then be measured to determine the state of cell R2. Alternatively, B3' could be grounded while the reading current is applied to B4 and B3.

Cell R2 may be written by asserting W1 274 to turn ON the writing switch M5 218. A writing current is then coupled through the first writing line B4, the writing switch M5 218, the pinned layer of R2, and the second writing line B3 279. The direction of the writing current, whether from first writing line B4 to second writing line B3 or from second writing line B3 to first writing line B4, determines the direction of the magnetic orientation programmed onto the cell R2.

Only the writing transistor M5 218 carries a large current. Therefore, the reading transistor M4 214 can be made very small. This results in a much smaller MRAM cell using this design. Note also that the architecture uses two word lines, W1 and W1' for each row of cells. This is because the cells share writing lines. For example, cell R1 shares writing line B3 with cell R2 and shares writing line B2 with cell R0. As a result, the first preferred embodiment requires only N+1 writing lines for an array having N columns. N reading lines are required for N columns. At the same time, the architecture requires 2M word lines for M rows. Because of the sharing of writing lines, complimentary word lines W1 and W1' are used to insure that no cells are half-selected as occurred in the prior art.

The first preferred embodiment architecture provides a MRAM device with a smaller cell structure due to a reduced transistor size. Preferably, the reading and writing switches comprise MOS transistors. More preferably, the switches comprise either NMOS or PMOS transistors.

Figure 7:
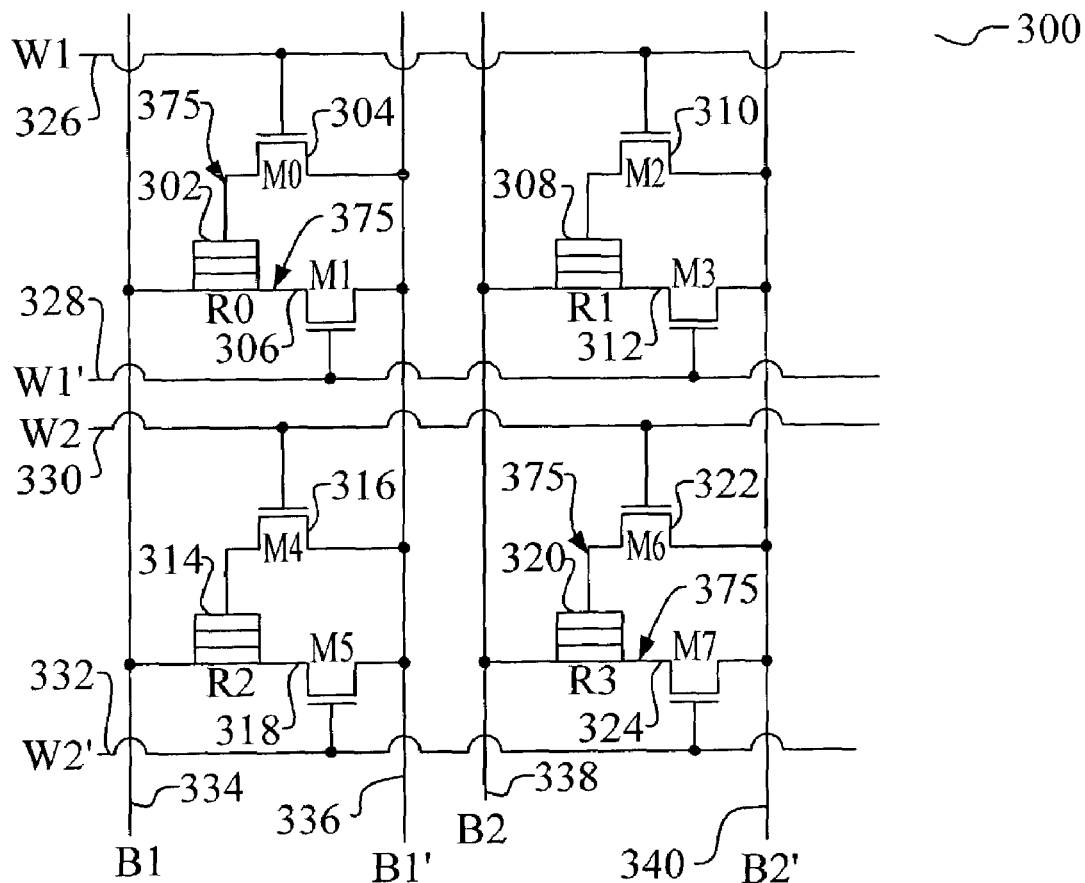
FIG. 7 illustrates a second preferred embodiment of a MRAM array of the present invention.
Figure 7:
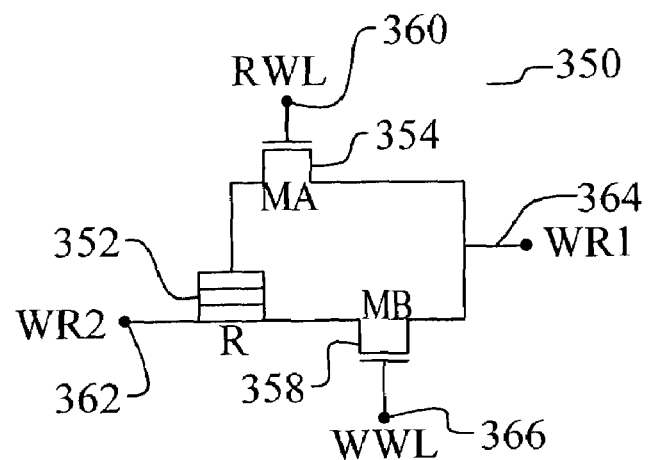

Referring now to FIG. 7, a second preferred embodiment of the present invention is illustrated. The MRAM cell 350 again comprises a 2T1R structure. However, in this case, the reading switch MA 354 and the writing switch MB 358 are coupled together to the first writing line WR1 364. Meanwhile, the reading switch MA 354 is controlled by a reading word line RWL 360 while the writing switch MB 358 is controlled by the writing word line WWL 336.

In the second preferred embodiment, for example, cell R2 314 is read by asserting W2 330 to turn ON the reading switch M4 316. A reading current is then forced through M4 316 and R2 314 and into the second writing line B1 334. The voltage of B1' is then measured to determine the cell state. Cell R2 314 is written by asserting W2' to turn ON the writing switch M5 318. A writing current is then forced through the first and second writing lines B1' and B1 and the pinned layer of R2 314 to write the cell. Note that only the writing transistor needs to be large. The reading transistor can be small to save space. This arrangement requires 2M word lines for M rows and 2N writing lines for N columns.

Figure 8:
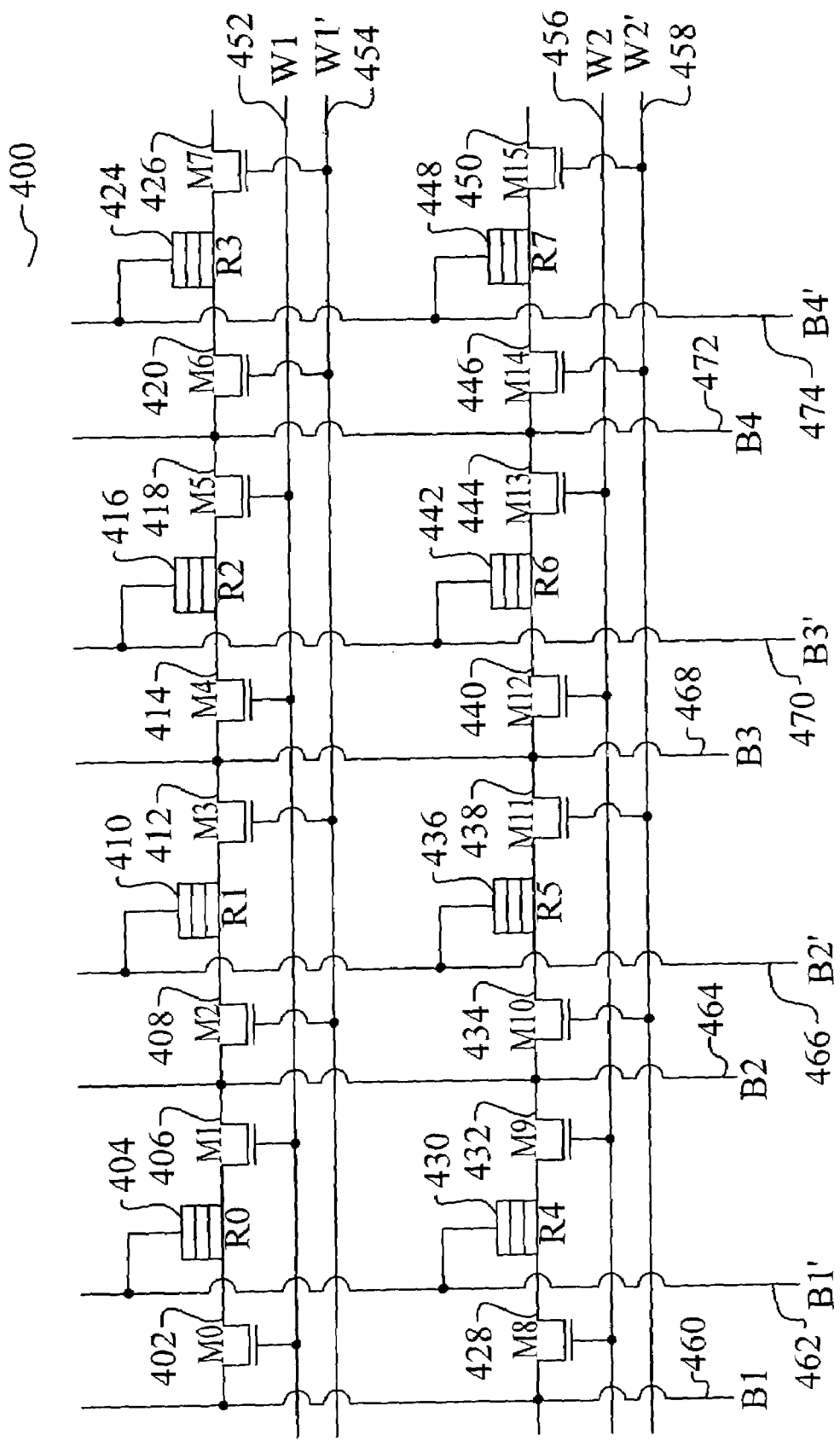
FIG. 8 illustrates a third preferred embodiment of a MRAM array of the present invention.

Referring now to FIG. 8, a third embodiment of the present invention is illustrated. This embodiment is also a 2T1R structure. In this case, both transistors for each cell are used to carry the writing current. For example, to program cell R1 410, the word line W1' is asserted to turn ON switches M2 and M3. A writing current is then coupled through the first and second writing lines B2 464 and B3 468 and through the cell R1 410 to program the cell. To read the cell R1 410, the word line W1 is again asserted to turn on the first and second switches M2 and M3. A reading current is then forced through the free layer and the pinned layer to measure the state.

In this arrangement, both of the switches M2 408 and M3 412 carry writing current. Therefore, this arrangement does not save cell area by reducing transistor area. Rather, this arrangement reduces the layout area by eliminating half of the writing lines. Only N writing lines and N reading lines are required for an array N columns wide. 2M word lines are required for an array M rows deep.

Referring again to FIG. 7, a method for forming an MRAM is also achieved. The method comprises providing a plurality of MTJ cells R0–R3 each comprising a free layer and a pinned layer separated by a dielectric layer. A plurality of reading switches M0, M2, M4, and M6 each comprising a MOS transistor having gate, drain, and source terminals is formed. A plurality of writing switches M1, M3, M5, and M7 each comprising a MOS transistor having gate, drain, and source terminals is formed. A patterned conductive layer 375 is formed. The patterned conductive layer 375 selectively couples each of the reading switch sources to one of the MTJ cell free layers. The patterned conductive layer 375 selectively couples one of the writing switch sources to a first end of one of the MTJ cell pinned layers.

The advantages of the present invention may now be summarized. An effective and very manufacturable magnetic RAM integrated circuit device is provided. A magnetic RAM device comprising a magnetic-tunnel junction (MTJ) device is achieved. The magnetic RAM cells comprise a write transistor, a read transistor, and one MTJ cell. The magnetic RAM cell has a reduced cell size. The magnetic RAM cells have low programming current. Efficient magnetic RAM array devices are achieved. Unique methods to write and to read a magnetic RAM cell are provided. A method to form a magnetic RAM array device is provided.

As shown in the preferred embodiments, the novel devices and method of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A magnetic RAM cell device comprising:
   a MTJ cell comprising a free layer and a pinned layer separated by a dielectric layer;
   a reading switch coupled between said free layer and a reading line; and
   a writing switch coupled between a first end of said pinned layer and a first writing line wherein a second end of said pinned layer is coupled to a second writing line.

2. The device according to claim 1 wherein said pinned layer comprises a ferromagnetic layer, an anti-ferromagnetic layer, and a conductor layer.

3. The device according to claim 1 wherein said reading and writing switches each comprise MOS transistors having drain, source, and gate terminals.

4. The device according to claim 3 wherein said MOS transistors comprise PMOS or NMOS.

5. The device according to claim 3 wherein said reading switch drain is coupled to said reading line, wherein said reading switch source is coupled to said free layer, wherein said writing switch source is coupled to said pinned layer, wherein said writing switch drain is coupled to said first writing line, and wherein said reading and writing switch gates are coupled together.

6. The device according to claim 3 wherein said reading switch drain is coupled to said reading line, wherein said reading switch source is coupled to said free layer, wherein said writing switch drain is coupled to said first writing line, wherein said writing switch source is coupled to said pinned layer, wherein said reading switch gate is coupled to a reading word line, and wherein said writing switch gate is coupled to a writing word line.

7. The device according to claim 1 wherein said reading line and said first writing line comprise a single line.

8. The device according to claim 1 wherein said magnetic RAM cell device is written by a method comprising:
   turning ON said writing switch; and
   coupling a writing current through said writing switch, said first writing line, said second writing line, and said pinned layer to generate a magnetic field to program said free layer.

9. The device according to claim 1 wherein said magnetic RAM cell device is read by a method comprising:
   turning ON said reading switch;
   coupling a reading current through said reading line, said reading switch, said free layer, and said pinned layer; and
   measuring voltage of said reading line.

10. A magnetic RAM array device comprising:
    a plurality of first writing lines;
    a plurality of second writing lines;
    a plurality of reading lines;
    a plurality of word lines; and
    a plurality of magnetic RAM cells wherein each said magnetic RAM cell comprises:
       a MTJ cell comprising a free layer and a pinned layer separated by a dielectric layer;
       a reading switch coupled between said free layer and one of said reading lines; and
       a writing switch coupled between a first end of said pinned layer and one of said first writing lines wherein said reading and writing switches are coupled to one of said word lines and wherein a second end of said pinned layer is coupled to one of said second writing lines.

11. The device according to claim 10 wherein adjacent said magnetic RAM cells in a row share a common bit line of said bit lines and wherein said adjacent magnetic RAM cells in a row do not share a common word line of said word lines.

12. The device according to claim 10 wherein said pinned layer comprises a ferromagnetic layer, an anti-ferromagnetic layer, and a conductor layer.

13. The device according to claim 10 wherein said reading and writing switches each comprise MOS transistors having drain, source, and gate terminals.

14. The device according to claim 13 wherein said MOS transistors comprise NMOS or PMOS.

15. The device according to claim 10 wherein one of said magnetic RAM cells in said array device is written by a method comprising:
    asserting said word line of a selected said magnetic RAM cell to thereby turn ON said writing switch of said selected magnetic RAM cell; and
    coupling a writing current through said writing switch, said first writing line, said second writing line, and said pinned layer of said selected magnetic RAM cell to generate a magnetic field to program said free layer of said selected magnetic RAM.

16. The device according to claim 10 wherein one of said magnetic RAM cells in said array device is read by a method comprising:
    asserting said word line of a selected said magnetic RAM cell to thereby turn ON said reading switch of said selected magnetic RAM cell;
    coupling a reading current through said reading line, said reading switch, said free layer, and said pinned layer of said selected magnetic RAM cell; and
    measuring voltage of said reading line of said selected magnetic RAM cell.

17. A magnetic RAM array device comprising:
a plurality of reading lines;
a plurality of writing lines;
a plurality of reading word lines;
a plurality of writing word lines; and
a plurality of magnetic RAM cells wherein each said magnetic RAM cell comprises:
 a MTJ cell comprising a free layer and a pinned layer separated by a dielectric layer;
 a reading switch coupled between said free layer and one of said reading lines wherein said reading switch is controlled by said one of said reading word lines; and
 a writing switch coupled between a first end of said pinned layer and one of said reading lines, wherein said writing switch is controlled by one of said writing word lines and wherein a second end of said pinned layer is coupled to one of said writing lines.

18. The device according to claim 17 wherein said pinned layer comprises a ferromagnetic layer, an anti-ferromagnetic layer, and a conductor layer.

19. The device according to claim 17 wherein said reading and writing switches each comprise MOS transistors having drain, source, and gate terminals.

20. The device according to claim 19 wherein said MOS transistors comprise NMOS or PMOS.

21. The device according to claim 17 wherein one of said magnetic RAM cells in said array device is written by a method comprising:
 asserting said writing word line of a selected said magnetic RAM cell to thereby turn ON said writing switch of said selected magnetic RAM cell; and
 coupling a writing current through said writing switch, said writing line, said reading line, and said pinned layer of said selected magnetic RAM cell to generate a magnetic field to program said free layer of said selected magnetic RAM.

22. The device according to claim 17 wherein one of said magnetic RAM cells in said array device is read by a method comprising:
 asserting said word line of a selected said magnetic RAM cell to thereby turn ON said reading switch of said selected magnetic RAM cell;
 coupling a reading current through said reading line, said writing line, said reading switch, said free layer, and said pinned layer of said selected magnetic RAM cell; and
 measuring voltage of said reading line of said selected magnetic RAM cell.

23. A method of forming a magnetic RAM cell array comprising:
 providing an plurality of MTJ cells each comprising a free layer and a pinned layer separated by a dielectric layer;
 forming a plurality of reading switches each comprising an MOS transistor having gate, drain, and source terminals;
 forming a plurality of writing switches each comprising an MOS transistor having gate, drain, and source terminals; and
 forming a patterned conductive layer wherein said patterned conductive layer selectively couples each of said reading switch sources to one of said MTJ cell free layers and wherein said patterned conductive layer selectively couples one of said writing switch sources to a first end of one of said MTJ cell pinned layers.

24. The method according to claim 23 wherein said pinned layer comprises a ferromagnetic layer, an anti-ferromagnetic layer, and a conductor layer.

25. The method according to claim 24 wherein said MOS transistors comprise NMOS or PMOS.

26. The method according to claim 23 further comprising forming a plurality of reading lines, writing lines, and word lines wherein each said reading switch drain is coupled to one of said reading lines, wherein each said reading switch source is coupled to one of said MTJ cell free layers, wherein each said writing switch source is coupled to one of said MTJ pinned layers, wherein each said writing switch drain is coupled to one of said writing lines, and wherein said reading and writing switches that are coupled to a single said MTJ cell have gates co-coupled to one of said word lines.

27. The method according to claim 23 further comprising forming a plurality of reading lines, writing lines, reading word lines, and writing word lines wherein each said reading switch drain is coupled to one of said reading lines, wherein each said reading switch source is coupled to one of said MTJ cell free layers, wherein each said writing switch source is coupled to one of said MTJ pinned layers, wherein each said writing switch drain is coupled to one of said writing lines, wherein said reading switches have gates coupled to one of said reading word lines, and wherein said writing switches have gates coupled to one of said writing word lines.

28. A magnetic RAM array device comprising:
a plurality of bit lines;
a plurality of reading lines;
a plurality of word lines; and
a plurality of magnetic RAM cells wherein each said magnetic RAM cell comprises:
 a MTJ cell comprising a free layer and a pinned layer separated by a dielectric layer wherein said free layer is coupled to one of said reading lines;
 a first switch coupled between a first end of said pinned layer and a first bit line of said bit lines; and
 a second switch coupled between a second end of said pinned layer and a second bit line of said bit lines, wherein said first switch and said second switch are controlled by one of said word lines, wherein adjacent said magnetic RAM cells in a row share a common bit line of said bit lines, and wherein said adjacent magnetic RAM cells in a row do not share a common word line of said word lines.

29. The device according to claim 28 wherein said pinned layer comprises a ferromagnetic layer, an anti-ferromagnetic layer, and a conductor layer.

30. The device according to claim 28 wherein said first and second switches each comprise MOS transistors having drain, source, and gate terminals.

31. The device according to claim 28 wherein alternating said MTJ cells in said row share a same word line of said word lines.

32. The device according to claim 28 wherein one of said magnetic RAM cells in said array device is written by a method comprising:
 asserting said writing word line of a selected said magnetic RAM cell to thereby turn ON said first and second switches of said selected magnetic RAM cell; and
 coupling a writing current through said first bit line, said second bit line, said first and second switches, and said pinned layer of said selected magnetic RAM cell to generate a magnetic field to program said free layer of said selected magnetic RAM.

33. The device according to claim 28 wherein one of magnetic RAM cells in said array device is read by a method comprising:

asserting said word line of a selected said magnetic RAM cell to thereby turn ON said first and second switches of said selected magnetic RAM cell;

coupling a reading current through said reading line, said first and second switches, said first and second bit lines, said free layer, and said pinned layer of said selected magnetic RAM cell; and measuring voltage of said reading line of said selected magnetic RAM cell.

* * * * *